(12) United States Patent
Shim et al.

(10) Patent No.: US 11,091,630 B2
(45) Date of Patent: Aug. 17, 2021

(54) RESIN COMPOSITION FOR SEMICONDUCTOR PACKAGE, PREPREG, AND METAL CLAD LAMINATE USING THE SAME

(71) Applicant: LG CHEM, LTD., Seoul (KR)

(72) Inventors: Chang Bo Shim, Daejeon (KR); Hee Yong Shim, Daejeon (KR); Hyun Sung Min, Daejeon (KR); Young Chan Kim, Daejeon (KR); Seung Hyun Song, Daejeon (KR)

(73) Assignee: LG CHEM, LTD, Seoul (KR)

( * ) Notice: Subject to any disclaimer, the term of this patent is extended or adjusted under 35 U.S.C. 154(b) by 0 days.

(21) Appl. No.: 16/333,082

(22) PCT Filed: Mar. 8, 2018

(86) PCT No.: PCT/KR2018/002780
§ 371 (c)(1),
(2) Date: Mar. 13, 2019

(87) PCT Pub. No.: WO2018/174447
PCT Pub. Date: Sep. 27, 2018

(65) Prior Publication Data
US 2019/0270881 A1 Sep. 5, 2019

(30) Foreign Application Priority Data

Mar. 22, 2017 (KR) .................. 10-2017-0036105
Feb. 13, 2018 (KR) .................. 10-2018-0018019

(51) Int. Cl.
| | | |
|---|---|---|
| *C08L 63/04* | (2006.01) | |
| *C08K 3/013* | (2018.01) | |
| *C08G 59/50* | (2006.01) | |
| *C08J 5/24* | (2006.01) | |
| *C08K 5/17* | (2006.01) | |
| *C08K 9/06* | (2006.01) | |
| *C08L 79/08* | (2006.01) | |
| *H01L 23/498* | (2006.01) | |
| *B32B 37/10* | (2006.01) | |
| *B32B 5/02* | (2006.01) | |
| *B32B 37/06* | (2006.01) | |
| *B32B 15/14* | (2006.01) | |
| *C08K 3/36* | (2006.01) | |

(52) U.S. Cl.
CPC .............. *C08L 63/04* (2013.01); *B32B 5/02* (2013.01); *B32B 15/14* (2013.01); *B32B 37/06* (2013.01); *B32B 37/10* (2013.01); *C08G 59/5033* (2013.01); *C08J 5/24* (2013.01); *C08K 3/013* (2018.01); *C08K 5/17* (2013.01); *C08K 9/06* (2013.01); *C08L 79/085* (2013.01); *H01L 23/49894* (2013.01); *C08J 2363/00* (2013.01); *C08J 2363/02* (2013.01); *C08J 2363/04* (2013.01); *C08J 2479/04* (2013.01); *C08K 3/36* (2013.01); *C08K 2201/003* (2013.01); *C08K 2201/005* (2013.01)

(58) Field of Classification Search
CPC ........ C08K 2201/005; C08K 2201/003; C08L 63/00–10; C09D 163/00–10; C09J 163/00–10; C09J 2363/00–10; C08G 59/50–5093
See application file for complete search history.

(56) References Cited

U.S. PATENT DOCUMENTS

| | | | |
|---|---|---|---|
| 2012/0101191 A1 | 4/2012 | Enomoto et al. | |
| 2013/0330563 A1 | 12/2013 | Kotake et al. | |
| 2014/0349089 A1 | 11/2014 | Ueyama et al. | |
| 2015/0319855 A1 | 11/2015 | Yoon et al. | |
| 2016/0369099 A1 | 12/2016 | Moon et al. | |
| 2017/0005021 A1 | 1/2017 | Kohara et al. | |
| 2017/0145251 A1* | 5/2017 | Ogawa | C09J 163/00 |
| 2017/0283672 A1 | 10/2017 | Inoue et al. | |
| 2018/0053703 A1 | 2/2018 | Bae et al. | |

FOREIGN PATENT DOCUMENTS

| | | | | |
|---|---|---|---|---|
| CN | 103906785 A | | 7/2014 | |
| JP | 2002-121358 A | | 4/2002 | |
| JP | 2011213784 A | * | 10/2011 | |
| JP | 2012-087250 A | | 5/2012 | |
| JP | 2013-104029 A | | 5/2013 | |
| JP | 2015-080882 A | | 4/2015 | |
| JP | 2015-086253 A | | 5/2015 | |
| JP | 2015-105304 A | | 6/2015 | |
| JP | 2016-037546 A | | 3/2016 | |
| KR | 10-2012-0079402 A | | 7/2012 | |
| KR | 10-2012-0079986 B1 | | 7/2012 | |
| KR | 10-2014-0004677 A | | 1/2014 | |
| KR | 10-2014-0076345 A | | 6/2014 | |
| KR | 10-2014-0087015 A | | 7/2014 | |
| KR | 10-2014-0090991 A | | 7/2014 | |
| KR | 10-2015-0037568 A | | 4/2015 | |
| KR | 10-2016-0129218 A | | 11/2016 | |
| TW | 201225224 A | | 6/2012 | |
| WO | WO-2015174141 A1 | * | 11/2015 | H01L 23/296 |
| WO | 2016-017751 A1 | | 2/2016 | |

OTHER PUBLICATIONS

Partial machine translation of JP 2011-213784 A (2020).*

(Continued)

*Primary Examiner* — Kregg T Brooks

(74) *Attorney, Agent, or Firm* — Dentons US LLP

(57) ABSTRACT

The present invention relates to a resin composition having high miscibility between internal components, low thermal expansion characteristics, and excellent mechanical properties, and a prepreg and a metal clad laminate formed from the same.

14 Claims, No Drawings

(56) References Cited

OTHER PUBLICATIONS

Laza, et al.: "Thermal scanning rheometer analysis of curing kinetic of an epoxy resin: 2. An amine as curing agent", XP004145540, Polymer, Elsevier Science Publishers B.V, vol. 40, No. 1, Jan. 1, 1999, pp. 35-45.
Anonymus: "Horiba Scientific: A Guidebook to Particle Size Analysis", XP055060732, Horiba Instruments, Inc., Retrieved from Internet: http://www.horiba.com/fileadmin/uploads/ Scientific/eMag/PSA/Guidebook/pdf/PSA_Guidebook.pdf [retreived on Apr. 23, 2013], pp. 1-32.

* cited by examiner

RESIN COMPOSITION FOR SEMICONDUCTOR PACKAGE, PREPREG, AND METAL CLAD LAMINATE USING THE SAME

This application is a National Phase entry pursuant to 35 U.S.C. § 371 of International Application No. PCT/KR2018/002780 filed on Mar. 8, 2018, and claims the benefit of priority from Korean Patent Application No. 10-2017-0036105 filed on Mar. 22, 2017 and Korean Patent Application No. 10-2018-0018019 filed on Feb. 13, 2018, the full disclosures of which are incorporated herein by reference.

FIELD

The present invention relates to a resin composition for a semiconductor package having high miscibility between internal components, low thermal expansion characteristics, and excellent mechanical properties, and a prepreg and a metal clad laminate using the same. More specifically, the present invention relates to a thermosetting resin composition for a semiconductor package capable of preparing a prepreg and a metal clad laminate exhibiting excellent physical properties even through a reflow process of a printed circuit board (PCB), and a prepreg using the same.

BACKGROUND

A copper clad laminate used in a conventional printed circuit board is manufactured by impregnating a glass fiber substrate with a thermosetting resin varnish, semi-curing the substrate to form a prepreg, and then pressurizing and heating the prepreg together with a copper foil. The prepreg is used for configuring and building up a circuit pattern on the copper clad laminate.

In recent years, as high-performance, thickness reduction, and weight reduction of electronic devices, communication devices, personal computers, smartphones, and the like have accelerated, and semiconductor packages have also been required to be thinner, there has been a growing need for thinner printed circuit boards for semiconductor packages.

However, the stiffness of the printed circuit board is decreased as a result of thinning, and warpage of the semiconductor package occurs due to a difference in thermal expansion rates between the chip and the printed circuit board. This warpage phenomenon is further aggravated by a phenomenon in which the printed circuit board is not recovered after repeatedly applying a high temperature in the PCB reflow process.

Therefore, in order to improve this warpage phenomenon, studies have been conducted on techniques for lowering the thermal expansion rate of a substrate. For example, a technique of filling a prepreg with a high content-filler has been proposed. However, filling the prepreg with a high content-filler, is limited because of lowering of the flow property of the prepreg.

Therefore, there is a need to develop a prepreg and a metal clad laminate which are capable of achieving a low thermal expansion rate and excellent mechanical properties while ensuring high miscibility between the filler and the resin.

SUMMARY

It is an object of the present invention to provide a resin composition for a semiconductor package having high miscibility between internal components, low thermal expansion characteristics, and excellent mechanical properties.

It is another object of the present invention to provide a prepreg and a metal clad laminate using the thermosetting resin composition for a semiconductor package.

The present invention provides a resin composition for a semiconductor package including: an amine curing agent containing one or more functional groups selected from the group consisting of a sulfone group, a carbonyl group, a halogen group, an alkyl group having 1 to 20 carbon atoms, an aryl group having 6 to 20 carbon atoms, a heteroaryl group having 2 to 20 carbon atoms, and an alkylene group having 1 to 20 carbon atoms; a thermosetting resin; and an inorganic filler containing a first inorganic filler having an average particle diameter of 0.1 μm to 100 μm and a second inorganic filler having an average particle diameter of 1 nm to 90 nm, wherein the thermosetting resin is contained in an amount of 400 parts by weight or less based on 100 parts by weight of the amine curing agent, and the alkyl group having 1 to 20 carbon atoms, the aryl group having 6 to 20 carbon atoms, the heteroaryl group having 2 to 20 carbon atoms, and the alkylene group having 1 to 20 carbon atoms contained in the amine curing agent are each independently substituted with one or more functional groups selected from the group consisting of a nitro group, a cyano group, and a halogen group.

The present invention also provides a prepreg obtained by impregnating a fiber substrate with the resin composition for a semiconductor package.

In addition, the present invention provides a metal clad laminate including: the prepreg; and a metal foil integrated with the prepreg by heating and pressurizing.

Hereinafter, a resin composition for a semiconductor package according to a specific embodiment of the present invention, and a prepreg and a metal clad laminate using the same, will be described in detail.

DETAILED DESCRIPTION

According to one embodiment of the present invention, a resin composition for a semiconductor package including: an amine curing agent containing one or more functional groups selected from the group consisting of a sulfone group, a carbonyl group, a halogen group, an alkyl group having 1 to 20 carbon atoms, an aryl group having 6 to 20 carbon atoms, and an alkylene group having 1 to 20 carbon atoms; a thermosetting resin; and an inorganic filler containing a first inorganic filler having an average particle diameter of 0.1 μm to 100 μm and a second inorganic filler having an average particle diameter of 1 nm to 90 nm, wherein the thermosetting resin is contained in an amount of 400 parts by weight or less based on 100 parts by weight of the amine curing agent, and the alkyl group having 1 to 20 carbon atoms, the alkyl group having 1 to 20 carbon atoms, and the alkylene group having 1 to 20 carbon atoms contained in the amine curing agent are each independently substituted with one or more functional groups selected from the group consisting of a nitro group, a cyano group, and a halogen group may be provided.

The present inventors have found that, when the resin composition for a semiconductor package of the one embodiment is used, the reactivity of the amine curing agent can be reduced through an amine curing agent containing a strong electron withdrawing group (EWG) such as one or more functional groups selected from the group consisting of a sulfone group, a carbonyl group, a halogen group, a substituted alkyl group having 1 to 20 carbon atoms, a substituted aryl group having 6 to 20 carbon atoms, a substituted heteroaryl group having 2 to 30 carbon atoms, and a substituted alkylene group having 1 to 20 carbon atoms, thereby easily controlling the curing reaction of the resin composition.

In particular, in the resin composition for a semiconductor package of the one embodiment, as the thermosetting resin is contained in an amount of 400 parts by weight or less based on 100 parts by weight of the amine curing agent, it is possible to prevent a change in physical properties of the thermosetting resin due to the filler charged at a high content, and induce uniform curing of the thermosetting resin at a sufficient level without being influenced by the filler, thereby improving the reliability of the finally manufactured product and improving the mechanical properties such as toughness.

Conventionally, as in the case where the thermosetting resin is contained in an amount of 400 parts by weight or less based on 100 parts by weight of the amine curing agent, addition of the amine curing agent in a relatively excessive amount causes problems that the flow property and moldability are reduced due to excessive curing of the thermosetting resin. However, even when a specific amine curing agent having decreased reactivity by including the electron withdrawing group (EWG) as described above is added in an excessive amount, the rapid increase in the curing rate of the thermosetting resin can be suppressed due to a reduction in the reactivity of the curing agent. Therefore, the resin composition for a semiconductor packages and the prepreg obtained therefrom can exhibit a high flow property even during long-term storage, and have an excellent flow property.

In addition, it was found through experiments that, as two types of fillers are mixed and added, the filler can be added with a high content into the prepreg, thereby realizing a low coefficient of thermal expansion, and at the same time improving the flow property of the filler. Furthermore, during the lamination process, a phenomenon in which the thermosetting resin and the filler are separated, that is, miscibility between the resin and the filler, is improved, thereby completing the present invention.

Specifically, the resin composition for a semiconductor package of the one embodiment may include an amine curing agent containing one or more functional groups selected from the group consisting of a sulfone group, a carbonyl group, a halogen group, an alkyl group having 1 to 20 carbon atoms, an aryl group having 6 to 20 carbon atoms, a heteroaryl group having 2 to 30 carbon atoms, and an alkylene group having 1 to 20 carbon atoms. In this case, the alkyl group having 1 to 20 carbon atoms, the aryl group having 6 to 20 carbon atoms, the heteroaryl group having 2 to 30 carbon atoms, and the alkylene group having 1 to 20 carbon atoms contained in the amine curing agent may each be independently substituted with one or more functional groups selected from the group consisting of a nitro group, a cyano group, and a halogen group.

The one or more functional groups selected from the group consisting of a sulfone group, a carbonyl group, a halogen group, a substituted alkyl group having 1 to 20 carbon atoms, a substituted aryl group having 6 to 20 carbon atoms, a substituted heteroaryl group having 2 to 30 carbon atoms, and a substituted alkylene group having 1 to 20 carbon atoms contained in the amine curing agent is a strong electron withdrawing group (EWG), and the amine curing agent containing the electron withdrawing group has reduced reactivity as compared with an amine curing agent not containing the electron withdrawing group, thereby easily controlling the curing reaction of the resin composition.

Therefore, while controlling the degree of curing reaction of the composition by the amine curing agent, a high content-inorganic filler can be introduced into the prepreg to lower the coefficient of thermal expansion of the prepreg and at the same time improve the flow property of the prepreg, thereby improving the filling property of the circuit pattern.

Specifically, the amine curing agent may include one or more compounds selected from the group consisting of the following Chemical Formulas 1 to 3.

[Chemical Formula 1]

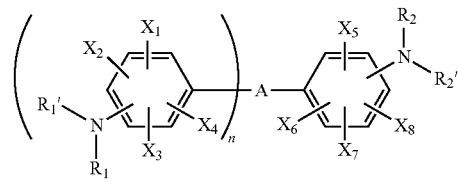

In Chemical Formula 1, A is a sulfone group, a carbonyl group, or an alkylene group having 1 to 10 carbon atoms, $X_1$ to $X_8$ are each independently a nitro group, a cyano group, a hydrogen atom, a halogen group, an alkyl group having 1 to 6 carbon atoms, an aryl group having 6 to 15 carbon atoms, or a heteroaryl group having 2 to 20 carbon atoms, $R_1$, $R_1'$, $R_2$, and $R_2'$ are each independently a hydrogen atom, a halogen group, an alkyl group having 1 to 6 carbon atoms, an aryl group having 6 to 15 carbon atoms, or a heteroaryl group having 2 to 20 carbon atoms, n is an integer of 1 to 10, and the alkylene group having 1 to 10 carbon atoms, the alkyl group having 1 to 6 carbon atoms, the aryl group having 6 to 15 carbon atoms, and the heteroaryl group having 2 to 20 carbon atoms are each independently substituted with one or more functional groups selected from the group consisting of a nitro group, a cyano group, a hydrogen atom, and a halogen group.

[Chemical Formula 2]

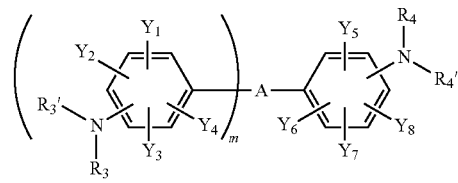

In Chemical Formula 2, $Y_1$ to $Y_8$ are each independently a nitro group, a cyano group, a hydrogen atom, a halogen group, an alkyl group having 1 to 6 carbon atoms, an aryl group having 6 to 15 carbon atoms, or a heteroaryl group having 2 to 20 carbon atoms, $R_3$, $R_3'$, $R_4$, and $R_4'$ are each independently a hydrogen atom, a halogen group, an alkyl group having 1 to 6 carbon atoms, an aryl group having 6 to 15 carbon atoms, or a heteroaryl group having 2 to 20 carbon atoms, m is an integer of 1 to 10, and the alkyl group having 1 to 6 carbon atoms, the aryl group having 6 to 15 carbon atoms, and the heteroaryl group having 2 to 20 carbon atoms are each independently substituted with one or more functional groups selected from the group consisting of a nitro group, a cyano group, and a halogen group.

[Chemical Formula 3]

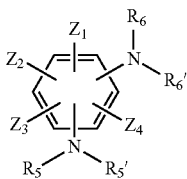

In Chemical Formula 3, $Z_1$ to $Z_4$ are each independently a nitro group, a cyano group, a hydrogen atom, a halogen group, an alkyl group having 1 to 6 carbon atoms, an aryl group having 6 to 15 carbon atoms, or a heteroaryl group having 2 to 20 carbon atoms, $R_5$, $R_5'$, $R_6$, and $R_6'$ are each independently a hydrogen atom, a halogen group, an alkyl group having 1 to 6 carbon atoms, an aryl group having 6 to 15 carbon atoms, or a heteroaryl group having 2 to 20 carbon atoms, and the alkyl group having 1 to 6 carbon atoms, the aryl group having 6 to 15 carbon atoms, and the heteroaryl group having 2 to 20 carbon atoms are each independently substituted with one or more functional groups selected from the group consisting of a nitro group, a cyano group, and a halogen group.

The alkyl group is a monovalent functional group derived from alkane, and examples thereof include a linear, branched, or cyclic group, such as methyl, ethyl, propyl, isobutyl, sec-butyl, tert-butyl, pentyl, hexyl, and the like.

The alkylene group is a divalent functional group derived from alkane, and examples thereof include a linear, branched, or cyclic group, such as a methylene group, an ethylene group, a propylene group, an isobutylene group, a sec-butylene group, a tert-butylene group, a pentylene group, a hexylene group, and the like. The one or more hydrogen atoms contained in the alkylene group can be substituted with substituents, similarly to the alkyl group.

The aryl group is a monovalent functional group derived from arene, which may be, for example, a monocyclic or polycyclic group. Specific examples of the monocyclic aryl group include, but are not limited to, a phenyl group, a biphenyl group, a terphenyl group, a stilbenyl group, and the like. Examples of the polycyclic aryl group include, but are not limited to, a naphthyl group, an anthryl group, a phenanthryl group, a pyrenyl group, a perylenyl group, a chrycenyl group, and a fluorenyl group. One or more hydrogen atoms of these aryl groups may be substituted with substituents, similarly to the alkyl group.

The heteroaryl group is a heterocyclic group containing O, N, or S as a heteroatom, and the carbon number thereof is not particularly limited, but may be from 2 to 30. Examples of the heterocyclic group include, but are not limited to, a thiophene group, a furan group, a pyrrole group, an imidazole group, a triazole group, an oxazole group, an oxadiazole group, a triazole group, a pyridyl group, a bipyridyl group, a triazine group, an acrydyl group, a pyridazine group, a quinolinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a dibenzofuranyl group, and the like. One or more hydrogen atoms of these heteroaryl groups may be substituted with substituents, similarly to the alkyl group.

The term "substituted" means that a hydrogen atom bonded to a carbon atom of a compound is changed into another functional group, and a position to be substituted is not limited as long as the position is a position at which the hydrogen atom is substituted, that is, a position at which the substituent can be substituted, and when two or more are substituted, the two or more substituents may be the same as or different from each other.

More specifically, the Chemical Formula 1 may include a compound represented by Chemical Formula 1-1 below.

[Chemical Formula 1-1]

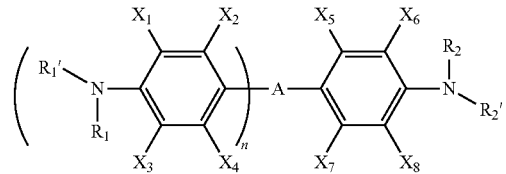

In Chemical Formula 1-1, A, $X_1$ to $X_8$, $R_1$, $R_1'$, $R_2$, $R_2'$, and n have the same meaning as defined in Chemical Formula 1.

Specific examples of Formula 1-1 include 4,4'-diaminodiphenyl sulfone (in Formula 1-1, A is a sulfone group, $X_1$ to $X_8$, $R_1$, $R_1'$, $R_2$, and $R_2'$ are each independently a hydrogen atom, and n is 1), bis(4-aminophenyl)methanone (in Formula 1-1, A is a carbonyl group, $X_1$, $X_2$, $R_1$, $R_1'$, $R_2$ and $R_2'$ are each independently a hydrogen atom, and n is 1), 4,4'-(perfluoropropane-2,2-diyl)dianiline (in Formula 1-1, A is perfluoropropane-2,2-diyl, $X_1$ to $X_8$, $R_1$, $R_1'$, $R_2$, and $R_2'$ are each independently a hydrogen atom, and n is 1), 4,4'-(2,2,2-trifluoroethane-1,1-diyl)dianiline (in Formula 1-1, A is 2,2,2-trifluoroethane-1,1-diyl, $X_1$ to $X_8$, $R_1$, $R_1'$, $R_2$, and $R_2'$ are each independently a hydrogen atom, and n is 1), and the like.

In addition, Chemical Formula 2 may include a compound represented by Chemical Formula 2-1 below.

[Chemical Formula 2-1]

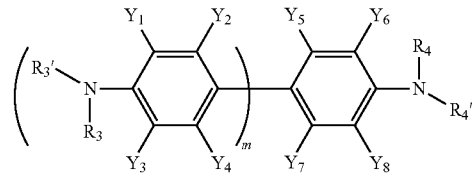

In Chemical Formula 2-1, $Y_1$ to $Y_8$, $R_3$, $R_3'$, $R_4$, $R_4'$, and m have the same meaning as defined in Chemical Formula 2.

Specific examples of Formula 2-1 include 2,2',3,3',5,5',6,6'-octafluorobiphenyl-4,4'-diamine (in Formula 2-1, $Y_1$ to $Y_8$ are a halogen group such as fluorine, $R_3$, $R_3'$, $R_4$, and $R_4'$ are each independently a hydrogen atom, and m is 1), 2,2'-bis(trifluoromethyl)biphenyl-4,4'-diamine (wherein $Y_2$ and $Y_7$ are each independently a trifluoromethyl group, $Y_1$, $Y_3$, $Y_4$, $Y_5$, $Y_6$, and $Y_8$ are a hydrogen atom $R_3$, $R_3'$, $R_4$, and $R_4'$ are each independently a hydrogen atom, and m is 1), and the like.

Further, Chemical Formula 3 may include a compound represented by Chemical Formula 3-1 below.

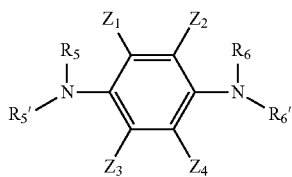

[Chemical Formula 3-1]

In Chemical Formula 3-1, $Z_1$ to $Z_4$, $R_5$, $R_5'$, $R_6$, and $R_6'$ have the same meaning as defined in Chemical Formula 3.

Specific examples of Formula 3-1 include 2,3,5,6-tetrafluorobenzene-1,4-diamine (in Formula 3-1, $Z_1$ to $Z_4$ are a halogen group such as fluorine, and $R_5$, $R_5'$, $R_6$, and $R_6'$ are each independently a hydrogen atom) and the like.

The content of the thermosetting resin may be 400 parts by weight or less, 150 parts by weight to 400 parts by weight, 180 parts by weight to 300 parts by weight, 180 parts by weight to 290 parts by weight, or 190 parts by weight to 290 parts by weight, based on 100 parts by weight of the amine curing agent. When the amine curing agent or the thermosetting resin is a mixture of two or more types thereof, the content of the thermosetting resin mixture may also be 400 parts by weight or less, 150 parts by weight to 400 parts by weight, 180 parts by weight to 300 parts by weight, 180 parts by weight to 290 parts by weight, or 190 parts by weight to 290 parts by weight, based on 100 parts by weight of the amine curing agent mixture.

If the content of the thermosetting resin is excessively increased to more than 400 parts by weight based on 100 parts by weight of the amine curing agent, the physical properties of the thermosetting resin may be changed due to the filler charged at a high content, and it is difficult for the thermosetting resin to be uniformly cured to a sufficient level due to the influence of the filler. Thus, there is a disadvantage that the reliability of the finally manufactured product may be deteriorated, and mechanical properties such as toughness may also be deteriorated.

In this case, the resin composition for a semiconductor package may have an equivalent ratio calculated by the following Mathematical Equation 1, of 1.4 or more, 1.4 to 2.5, 1.45 to 2.5, 1.45 to 2.1, 1.45 to 1.8, or 1.49 to 1.75.

Equivalent ratio=Total active hydrogen equivalent weight contained in the amine curing agent/ Total curable functional group equivalent weight contained in the thermosetting resin    [Mathematical Equation 1]

More specifically, in Mathematical Equation 1, the total active hydrogen equivalent weight contained in the amine curing agent means a value obtained by dividing the total weight (unit: g) of the amine curing agent by the active hydrogen unit equivalent weight (g/eq.) of the amine curing agent.

When the amine curing agent is a mixture of two or more types thereof, the values are calculated by dividing the weight (unit: g) for each compound by the active hydrogen unit equivalent weight (g/eq.), and by using the value obtained by totaling the divided values, the total active hydrogen unit equivalent weight contained in the amine curing agent according to Mathematical Equation 1 can be determined.

The active hydrogen contained in the amine curing agent means a hydrogen atom contained in the amino group ($-NH_2$) present in the amine curing agent, and the active hydrogen can form a curing structure through reaction with the curing functional group of the thermosetting resin.

Further, in Mathematical Equation 1, the total curable functional group equivalent weight contained in the thermosetting resin means a value obtained by dividing the total weight (unit: g) of the thermosetting resin by the curable functional unit equivalent weight (g/eq.) of the thermosetting resin.

When the thermosetting resin is a mixture of two or more types thereof, the values are calculated by dividing the weight (unit: g) for each compound by the curable functional group unit equivalent weight (g/eq.), and by using the value obtained by totaling the divided values, the total curable functional group equivalent weight contained in the thermosetting resin according to Mathematical Equation 1 can be determined.

The curable functional group contained in the thermosetting resin means a functional group forming a curing structure through reaction with the active hydrogen of the amine curing agent, and the type of the curable functional group may vary depending on the type of the thermosetting resin.

For example, when an epoxy resin is used as the thermosetting resin, the curable functional group contained in the epoxy resin may be an epoxy group. When a bismaleimide resin is used as the thermosetting resin, the curable functional group contained in the bismaleimide resin can be a maleimide group.

That is, the fact that the resin composition for a semiconductor package satisfies the equivalent ratio calculated by the Mathematical Equation 1 of 1.4 or more means that the amine curing agent is contained at such a level that the curable functional group contained in all thermosetting resins causes a sufficient curing reaction. Therefore, in the resin composition for a semiconductor package, when the equivalent ratio calculated by Mathematical Equation 1 decreases to less than 1.4, the physical property of the thermosetting resin may change due to the filler charged at a high content, and the thermosetting resin is difficult to be uniformly cured to a sufficient level due to the influence of the filler. Thus, there is a disadvantage that the reliability of the finally manufactured product may be deteriorated, and mechanical properties such as toughness may also be deteriorated.

In addition, the resin composition for a semiconductor package of the one embodiment may include a thermosetting resin.

The thermosetting resin may include at one or more resins selected from the group consisting of an epoxy resin, a bismaleimide resin, a cyanate ester resin, and a bismaleimide-triazine resin.

In this case, as the epoxy resin, those commonly used for a resin composition for a semiconductor package can be used without limitation, and the type thereof is not limited and may include one or more selected from the group consisting of a bisphenol A type of epoxy resin, a phenol novolac type of epoxy resin, a phenyl aralkyl type of epoxy resin, a tetraphenyl ethane type of epoxy resin, a naphthalene type of epoxy resin, a biphenyl type of epoxy resin, a dicyclopentadiene type of epoxy resin, and a mixture of a dicyclopentadiene type of epoxy resin and a naphthalene type of epoxy resin.

Specifically, the epoxy resin may include one or more selected from the group consisting of a bisphenol A type of epoxy resin represented by the following Chemical Formula 5, a novolac type of epoxy resin represented by the following Chemical Formula 6, a phenylaralkyl type of epoxy resin represented by the following Chemical Formula 7, a tetraphenyl ethane type of epoxy resin represented by the following Chemical Formulas 8, a naphthalene type of epoxy resin represented by the following Chemical Formulae 9 and 10, a biphenyl type of epoxy resin represented by the following Chemical Formula 11, and a dicyclopentadiene type of epoxy resin represented by the following Chemical Formula 12.

[Chemical Formula 5]

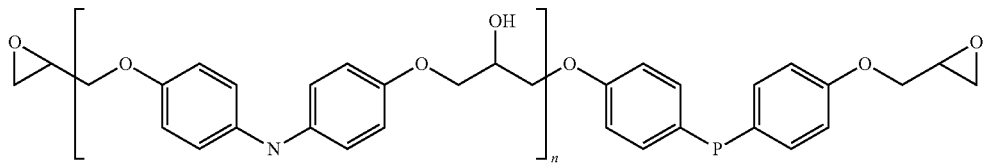

In Chemical Formula 5,
R is

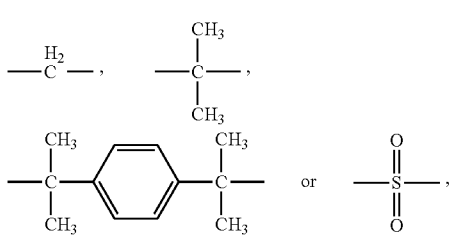

and n is an integer of 0 or 1 to 50.

More specifically, the epoxy resin of Chemical Formula 5 may be a bisphenol-A type of epoxy resin, a bisphenol-F type of epoxy resin, a bisphenol-M type of epoxy resin, or a bisphenol-S type of epoxy resin, respectively, depending on the type of R.

[Chemical Formula 6]

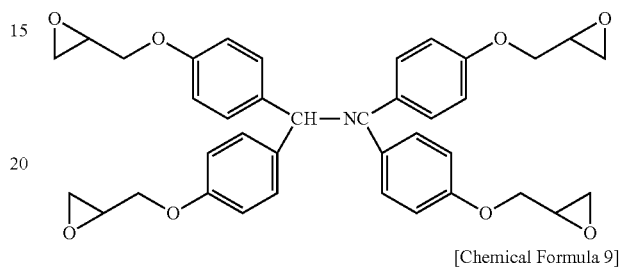

In Chemical Formula 6,
R is H or $CH_3$, and
n is an integer of 0 or 1 to 50.

More specifically, the novolac type of epoxy resin of Chemical Formula 6 may be a phenol novolac type of epoxy resin or a cresol novolac type of epoxy resin, respectively, depending on the type of R.

[Chemical Formula 7]

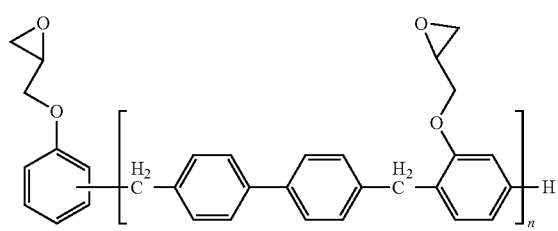

[Chemical Formula 8]

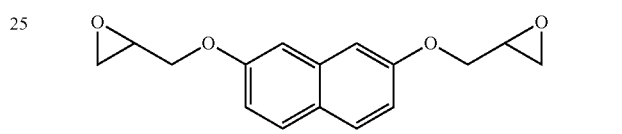

[Chemical Formula 9]

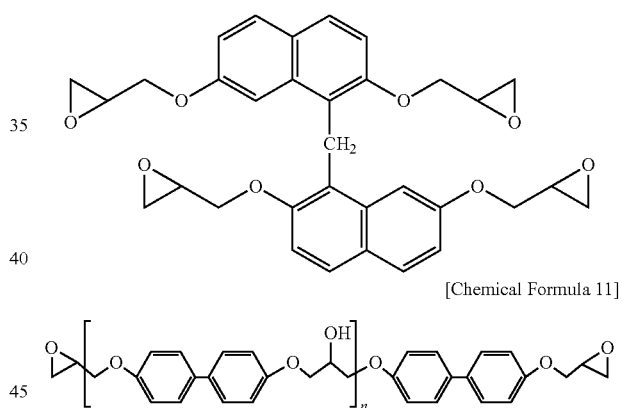

[Chemical Formula 10]

[Chemical Formula 11]

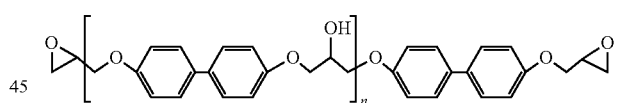

In Chemical Formula 11,
n is an integer of 0 or 1 to 50.

[Chemical Formula 12]

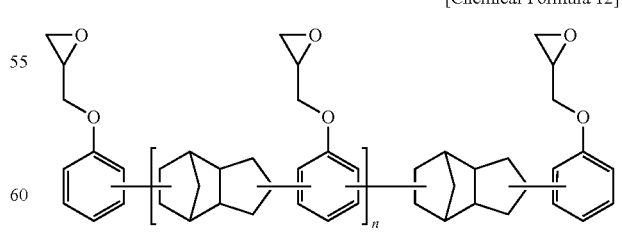

In Chemical Formula 12, n is an integer of 0 or 1 to 50.

Further, when the resin composition for a semiconductor package contains an epoxy resin, a curing agent of an epoxy resin can be used together therewith for curing.

As the curing agent of the epoxy resin, those commonly used for the resin composition for a semiconductor package can be used without limitation, and the type thereof is not limited. For example, a phenol novolac type, an amine type, a thiol type, an acid anhydride type, and the like may be mentioned, and these may be used alone or in a combination of two or more types thereof.

Further, as the curing agent of the epoxy resin, those commonly used for the resin composition for a semiconductor package can be used without limitation, and the type thereof is not limited.

As a preferable example, the bismaleimide resin may be one or more selected from the group consisting of a diphenylmethane type of bismaleimide resin represented by the following Chemical Formula 13, a phenylene type of bismaleimide resin represented by the following Chemical Formula 14, a bisphenol A type of diphenyl ether bismaleimide resin represented by the following Chemical Formula 15, and an oligomer of a diphenylmethane type of bismaleimide resin and a phenylmethane type of bismaleimide resin represented by the following Chemical Formula 16.

[Chemical Formula 13]

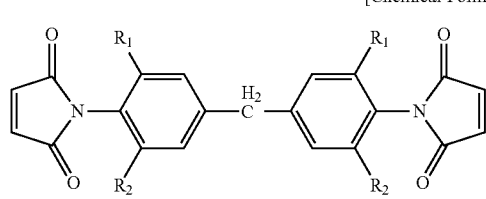

In Chemical Formula 13,
$R_1$ and $R_2$ are each independently H, $CH_3$, or $C_2H_5$.

[Chemical Formula 14]

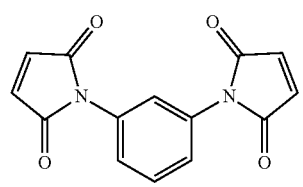

[Chemical Formula 15]

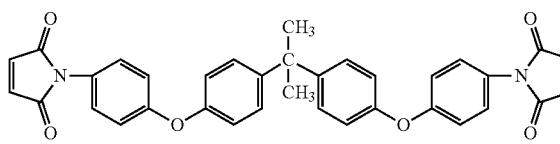

[Chemical Formula 16]

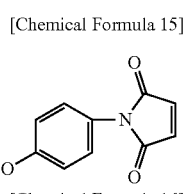

in Chemical Formula 16,
n is an integer of 0 or 1 to 50.

In addition, as the cyanate ester resin, those commonly used for a resin composition for a semiconductor package can be used without limitation, and the type thereof is not limited.

As a preferable example, the cyanate ester resin may be a novolac type of cyanate resin represented by the following Chemical Formula 17, a dicyclopentadiene type of cyanate resin represented by the following Chemical Formula 18, a bisphenol type of cyanate resin represented by the following Chemical Formula 19, and their partially-triazinated prepolymers. These can be used alone or in a combination of two or more types thereof.

[Chemical Formula 17]

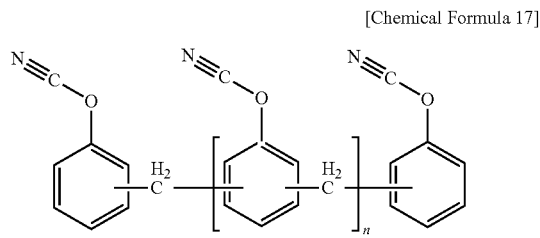

In Chemical Formula 17,
n is an integer of 0 or 1 to 50.

[Chemical Formula 18]

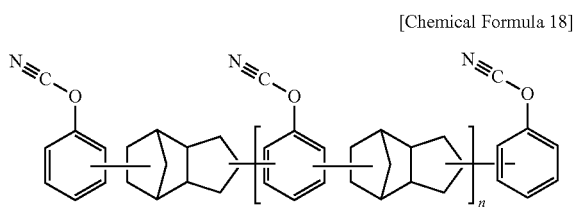

In Chemical Formula 18,
n is an integer of 0 or 1 to 50.

[Chemical Formula 19]

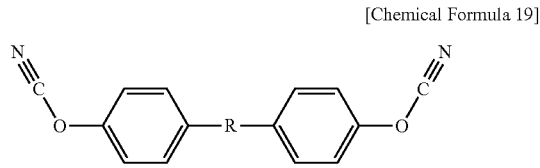

In Chemical Formula 19,
R is

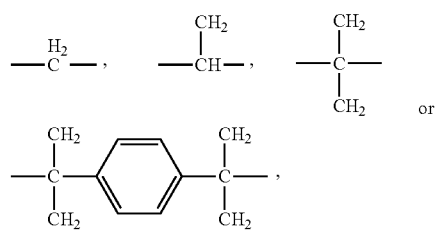

More specifically, the cyanate resin of Chemical Formula 19 may be a bisphenol-A type of cyanate resin, a bisphenol-E type of cyanate resin, a bisphenol-F type of cyanate resin, or a bisphenol-M type of cyanate resin, respectively, depending on the type of R.

As the bismaleimide-triazine resin, those commonly used for the resin composition for a semiconductor package can be used without limitation, and the type thereof is not limited.

In addition, the resin composition for a semiconductor package of one embodiment may include an inorganic filler. As the inorganic filler, those commonly used for the resin composition for a semiconductor package can be used without limitation, and the type thereof is not limited. Specific examples thereof include one or more selected from the group consisting of silica, aluminum trihydroxide, magnesium hydroxide, molybdenum oxide, zinc molybdate, zinc borate, zinc stannate, alumina, clay, kaolin, talc, calcined kaolin, calcined talc, mica, short glass fiber, glass fine powder, and hollow glass.

Specifically, the resin composition for a semiconductor package of the one embodiment contains a first inorganic filler having an average particle diameter of 0.1 μm to 100 μm, and a second inorganic filler having an average particle diameter of 1 nm to 90 nm. The second inorganic filler having an average particle diameter of 1 nm to 90 nm may be contained in an amount of 1 part by weight to 50 parts by weight, 5 part by weight to 50 parts by weight, or 20 parts by weight to 50 parts by weight, based on 100 parts by weigh of the first inorganic filler having an average particle diameter of 0.1 μm to 100 μm. When the first inorganic filler and the second inorganic filler are mixed and used as described above, it is possible to increase the packing density and thus the filling ratio by using a small-sized nanoparticle and a large-sized microparticle together, and also the flow property of the inorganic filler can be increased.

According to a preferred embodiment of the present invention, the first inorganic filler and the second inorganic filler may be silicas that are surface-treated with a silane coupling agent from the viewpoint of improving moisture resistance and dispersibility.

As a method of surface-treating the inorganic filler, a method of treating silica particles by a dry method or a wet method using a silane coupling agent as a surface treatment agent can be used. For example, silica that is surface-treated by a wet method using a silane coupling agent in an amount of 0.01 to 1 part by weight based on 100 parts by weight of silica particles can be used.

Specific examples of the silane coupling agent include an aminosilane coupling agent such as 3-aminopropyltriethoxysilane, N-phenyl-3-aminopropyltrimethoxysilane, and N-2-(aminoethyl)-3-aminopropyltrimethoxysilane, an epoxy silane coupling agent such as 3-glycidoxypropyltrimethoxysilane, a vinyl silane coupling agent such as 3-methacryloxypropyltrimethoxysilane, a cationic silane coupling agent such as N-2-(N-vinylbenzylaminoethyl)-3-aminopropyltrimethoxysilane hydrochloride, and a phenylsilane coupling agent. The silane coupling agent can be used alone, or if necessary, at least two silane coupling agents can be used in combination.

More specifically, the silane compound may include aromatic aminosilane or (meth)acrylsilane. As the first inorganic filler having an average particle diameter of 0.1 μm to 100 μm, silicas treated with an aromatic amino silane can be used, and as the second inorganic filler having an average particle diameter of 1 nm to 90 nm, silicas treated with a (meth)acryl silane can be used. A specific example of the silicas treated with an aromatic aminosilane includes SC2050MTO (Admantechs). A specific example of the silicas treated with (meth)acryl silanes includes AC4130Y (Nissan Chemical). The (meth)acryl is intended to cover both acrylic and methacrylic.

The inorganic filler may be dispersed in the resin composition for a semiconductor package. The fact that the inorganic filler is dispersed in the resin composition for a semiconductor package means that the inorganic filler and other components (thermosetting resin or amine curing agent, etc.) contained in the resin composition for a semiconductor package are mixed without being separated. That is, the resin composition for a semiconductor package of the one embodiment does not form a separated phase such as an inorganic filler-separated phase composed of two or more inorganic fillers or a resin-separated phase composed of a thermosetting resin, but can form a dispersed phase by uniform mixing of the filler and the thermosetting resin. As a result, even when the inorganic filler is filled at a high content, the prepreg can realize an appropriate level of flowability, a low coefficient of thermal expansion, and a good mechanical properties.

On the other hand, the content of the inorganic filler may be 200 parts by weight or more, 200 parts by weight to 500 parts by weight, or 250 parts by weight to 400 parts by weight, based on 100 parts by weight of the amine curing agent and the thermosetting resin. When the content of the filler is less than about 200 parts by weight, the coefficient of thermal expansion is increased and thus the warpage phenomenon is aggravated during the reflow process, and the stiffness of the printed circuit board is reduced.

The resin composition for a semiconductor package of the one embodiment can be used as a solution by adding a solvent if necessary. If the solvent exhibits good solubility for the resin component, the type thereof is not particularly limited, and alcohols, ethers, ketones, amides, aromatic hydrocarbons, esters, nitriles, and the like can be used. These can be used alone or a mixed solvent of two or more thereof can be used. The content of the solvent is not particularly limited as long as it can cause the resin composition to be impregnated into the glass fiber at the time of producing the prepreg.

In addition, the resin composition of the present invention may further include various other polymeric compounds such as other thermosetting resins, thermoplastic resins and oligomers and elastomers thereof, and other flame retardant compounds or additives, as long as the inherent characteristics of the resin composition are not impaired. These are not particularly limited as long as they are selected from those that are commonly used. Examples of the additives include ultraviolet absorbers, antioxidants, photopolymerization initiators, fluorescent brightening agents, photosensitizers, pigments, dyes, thickeners, lubricants, antifoaming agents, dispersants, leveling agents, and brighteners. The composition can used by mixing them so as to match the purpose.

The resin composition for a semiconductor package of the one embodiment can have a coefficient of thermal expansion (CTE) of 15 ppm/° C. or less, or 5 ppm/° C. to 15 ppm/° C. Specifically, the coefficient of thermal expansion means a measured value obtained by a process in which the copper foil layer is removed by etching in the state of the copper clad laminate obtained from the resin composition for a semiconductor package, a test specimen is prepared in the MD direction, and then measurement is performed from 30° C. to 260° C. at a heating rate of 10° C./min by using TMA (TA Instruments, Q400) to obtain the measured value in the temperature range of 50° C. to 150° C.

As the resin composition for a semiconductor package has a low coefficient of thermal expansion as described above, it can minimize the generation of warpage of the semiconductor package caused by a difference in thermal expansion rates between the chip and the printed circuit board in the process of preparing or building up a metal clad laminate. Therefore, the metal clad laminate containing the prepreg can be successfully used for the build-up of the printed circuit board for a semiconductor package.

The resin composition for a semiconductor package of the one embodiment may have resin flow of 10% to 25%, or 15% to 25%, as measured by IPC-TM-650 (2.3.17). Specifically, the resin flow can be measured according to IPC-TM-650 (2.3.17) using a Carver press in a prepreg state obtained from the resin composition for a semiconductor package. Since the resin composition for a semiconductor package has the above-mentioned level of resin flow, it is possible to ensure a flow property in the process of preparing or building up a metal clad laminate, so that a fine pattern can be easily filled. Therefore, the metal clad laminate can be successfully used for the build-up of the printed circuit board for a semiconductor package.

When the resin flow of the resin composition for a semiconductor package is excessively reduced, the filling of fine patterns decreases during the metal lamination and build-up process, resulting in the generation of laminate voids and the reduction of process yield and efficiency. Further, when the resin flow of the resin composition for a semiconductor package is excessively increased, there arises a problem of uneven thickness of the printed circuit board due to excessive resin flow during the lamination process, or the thickness may be thinner than the designed thickness, and thus the stiffness can be reduced.

The resin composition for a semiconductor package of the one embodiment has a minimum viscosity at 140° C. or higher, or 145° C. to 165° C., and the minimum viscosity may be 100 Pa·s to 500 Pa·s, 150 Pa·s to 400 Pa·S, 200 Pa·s to 350 Pa·s, or 250 Pa·s to 320 Pa·s. Specifically, the viscosity can be measured using a modular compact rheometer MCR 302 (Anton Paar) in a prepreg state obtained from the resin composition for a semiconductor package. As the resin composition for a package exhibits the above-mentioned level of viscosity, the flow property can be ensured in the process of preparing a metal clad laminate or in a build-up process, so that a fine pattern can be easily filled. Therefore, the metal clad laminate can be successfully used for the build-up of the printed circuit board for a semiconductor package.

Further, the resin composition for a semiconductor package of the one embodiment may have tensile elongation of 2.0% or more, 2.0% to 5.0%, 2.0% to 3.0%, or 2.5% to 3.0%, as measured by IPC-TM-650 (2.4.18.3). Specifically, the tensile elongation can be measured by a process in which, in the prepreg state obtained from the resin composition for a semiconductor package, ten sheets are laminated such that the MD and TD directions of the glass fibers are aligned parallel to each other, and pressed for 100 minutes under conditions of 220° C. and 35 kg/cm$^2$, and then the tensile elongation in the MD direction is measured using a Universal Testing Machine (Instron 3365) according to IPC-TM-650 (2.4.18.3). As the resin composition for a semiconductor package exhibits the above-mentioned level of viscosity, the flow property can be ensured in the process of preparing a metal clad laminate or in a build-up process, so that a fine pattern can be easily filled. Therefore, due to excellent durability, it can be successfully used for the build-up of the printed circuit board for a semiconductor package.

On the other hand, according to another embodiment of the present invention, a prepreg produced by impregnating the resin composition for a semiconductor package into a fiber substrate may be provided.

The prepreg means that the resin composition for a semiconductor package is impregnated into the fiber substrate in a semi-cured state.

The type of the fiber substrate is not particularly limited, but a glass fiber substrate, a synthetic fiber substrate made of a woven fabric or non-woven fabric composed mainly of a polyamide-based resin fiber such as a polyamide resin fiber, an aromatic polyamide resin fiber, or the like, a polyester-based resin fiber such as a polyester resin fiber, an aromatic polyester resin fiber, a wholly aromatic polyester resin fiber or the like, a polyimide resin fiber, a polybenzoxazole fiber, a fluororesin fiber and the like, a paper substrate composed mainly of kraft paper, cotton linter paper, linter/kraft pulp-mixed paper, and the like can be used. Preferably, a glass fiber substrate is used. The glass fiber substrate can improve the strength of the prepreg, reduce the water absorption rate, and reduce the coefficient of thermal expansion.

The glass substrate used in the present invention can be selected from glass substrates used for various printed circuit board materials. Examples thereof include, but are not limited to, glass fibers such as E glass, D glass, S glass, T glass, NE glass, and L glass. The glass substrate can be selected in accordance with the intended use or performance, as necessary. The form of the glass substrate is typically a woven fabric, a nonwoven fabric, a roving, a chopped strand mat, or a surfacing mat. The thickness of the glass substrate is not particularly limited, but it may be about 0.01 mm to 0.3 mm or the like. Among the above materials, the glass fiber material is more preferable in terms of strength and water absorption characteristics.

In addition, in the present invention, the method for preparing the prepreg is not particularly limited, and may be manufactured by a method that is well known in the art. For example, the preparation method of the prepreg may be an impregnation method, a coating method using various coaters, a spraying method, or the like.

In the case of the impregnation method, a prepreg can be prepared by preparing a varnish and then impregnating the fiber substrate with the varnish.

The preparation conditions of the prepreg are not particularly limited, but it is preferable to use them in a varnish state in which a solvent is added to the resin composition for a semiconductor package. The solvent for a resin varnish is not particularly limited as long as it is miscible with the resin component and has good solubility. Specific examples thereof include ketones such as acetone, methyl ethyl ketone, methyl isobutyl ketone, and cyclohexanone, aromatic hydrocarbons such as benzene, toluene, and xylene, amides such as dimethylformamide and dimethylacetamide, and aliphatic alcohols such as methyl cellosolve and butyl cellosolve.

In addition, it is desirable that the used solvent volatilizes by at least 80% by weight at the time of preparing the prepreg. Therefore, there is no limitation on the production method, drying conditions, etc., and the drying temperature is about 80° C. to 200° C. The drying time is not particularly limited as long as it is in balance with the gelling time of the varnish. The impregnation amount of the varnish is preferably such that the resin solid content of the varnish is about 30 to 80% by weight based on the total amount of the resin solid content of the varnish and the substrate.

The prepreg of an alternative embodiment may have a coefficient of thermal expansion (CTE) of 15 ppm/° C. or less, or 5 ppm/° C. to 15 ppm/° C. The details of the coefficient of thermal expansion includes those described above in the resin composition for a semiconductor package of the embodiment.

The prepreg of the alternative embodiment may have a resin flow of 10% to 25%, or 15% to 25%, as measured by IPC-TM-650 (2.3.17). The details of the resin flow include those described above with reference to the resin composition for a semiconductor package of the one embodiment.

Further, the prepreg of the alternative embodiment may have a minimum viscosity of 140° C. or higher, or 145° C. to 165° C., and the minimum viscosity may be 100 Pa·s to 500 Pa·s, 150 Pa·s to 400 Pa·s, 200 Pa·s to 350 Pa·s, or 250 Pa·s to 320 Pa·s. The details of the viscosity include those described above with reference to the resin composition for a semiconductor package of the one embodiment.

Further, the prepreg of the alternative embodiment may have tensile elongation of 2.0% or more, 2.0% to 5.0%, 2.0% to 3.0%, or 2.3% to 3.0%, as measured by IPC-TM-650 (2.4.18.3). The details of the tensile elongation include those described above with reference to the resin composition for a semiconductor package of the one embodiment.

According to another embodiment of the present invention, a metal clad laminate may be provided, including: the above-mentioned prepreg; and a metal foil integrated with the prepreg by heating and pressurizing.

The metal foil includes: a copper foil; an aluminum foil; a composite foil having a three-layer structure containing an intermediate layer of nickel, nickel-phosphorus, a nickel-tin alloy, a nickel-iron alloy, lead, or a lead-tin alloy, and containing copper layers having different thicknesses on both sides thereof; or a composite foil having a two-layer structure in which aluminum and a copper foil are combined.

According to a preferred embodiment, the metal foil used in the present invention is a copper foil or an aluminum foil, and those having a thickness of about 2 µm to 200 µm can be used, but those having a thickness of about 2 µm to 35 µm are preferred. Preferably, a copper foil is used as the metal foil. Further, according to the present invention, a composite foil having a three-layer structure containing an intermediate layer of nickel, nickel-phosphorus, a nickel-tin alloy, a nickel-iron alloy, lead, a lead-tin alloy, or the like, and containing copper layers having different thicknesses on both sides thereof; or a composite foil having a two-layer structure in which aluminum and a copper foil are combined can be used as the metal foil.

The metal clad laminate including the prepreg thus prepared can be used for manufacturing a double-sided or multilayer printed circuit board after one or more sheets are laminated. In the present invention, the metal clad laminate may be subjected to circuit processing to produce a double-sided or multi-layer printed circuit board, and the circuit processing may be carried out by a method which is commonly used in manufacturing processes of double-sided or multilayer printed circuit boards.

Advantageous Effects

According to the present invention, a resin composition for a semiconductor package having high miscibility between internal components, low thermal expansion characteristics, and excellent mechanical properties, and a prepreg and a metal clad laminate using the same, can be provided.

EXAMPLES

Hereinafter, the present invention will be described in more detail through examples. However, these examples are presented for illustrative purposes only, and are not intended to limit the present invention thereto in any way.

Examples and Comparative Examples: Resin Composition for Semiconductor Package, Prepreg, and Copper Clad Laminate (1) Preparation of Resin Composition for Semiconductor Package In accordance with the compositions shown in Tables 1 and 2 below, each component was added to methyl ethyl ketone so as to match the solid content of 65%, and then the mixture was stirred at a speed of 400 rpm at room temperature for one day to prepare resin compositions for semiconductor packages (resin varnishes) of Examples 1 to 5 and Comparative Examples 1 to 4. Particularly, the specific compositions of the resin compositions prepared in Examples 1 to 5 are as described in Table 1 below, and specific compositions of the resin compositions prepared in Comparative Examples 1 to 4 are as described in Table 2 below.

(2) Preparation of Prepreg and Copper Clad Laminate

The resin compositions (resin varnishes) for a semiconductor package prepared above were impregnated into glass fiber (T-glass #1017, manufactured by Nittobo) having a thickness of 15 µm, and then hot air-dried at a temperature of 170° C. for 2 to 5 minutes to prepare a prepreg having a thickness of 25 µm.

Two sheets of the prepregs prepared above were laminated, and then a copper foil (12 µm in thickness, manufactured by Mitsui) was positioned and laminated on both sides thereof and cured for 100 minutes under the conditions of 220° C. and 35 kg/cm$^2$.

TABLE 1

Composition of the resin compositions for semiconductor package of examples

| | Class | Example 1 (unit: g) | Example 2 (unit: g) | Example 3 (unit: g) | Example 4 (unit: g) | Example 5 (unit: g) |
|---|---|---|---|---|---|---|
| Epoxy resin | XD-1000 (Epoxy unit equivalent weight: 253 g/eq.) | 20 | 20 | — | — | — |
| | NC-3000H (Epoxy unit equivalent weight: 290 g/eq.) | 48 | 48 | — | 48 | 65.5 |
| | HP-6000 (Epoxy unit equivalent weight: 250 g/eq.) | — | — | 60 | 20 | — |
| Bismaleimide | BMI-2300 (Maleimide unit equivalent weight: 179 g/eq.) | 6.2 | 6.2 | 6.2 | 6.2 | 6.2 |

TABLE 1-continued

Composition of the resin compositions for semiconductor package of examples

| Class | | Example 1 (unit: g) | Example 2 (unit: g) | Example 3 (unit: g) | Example 4 (unit: g) | Example 5 (unit: g) |
|---|---|---|---|---|---|---|
| Amine curing agent | DDS (Active hydrogen unit equivalent weight: 62 g/eq.) | 25.8 | 25.8 | — | 25.8 | 28.3 |
| | TFB (Active hydrogen unit equivalent weight: 80 g/eq.) | — | — | 33.8 | — | — |
| | DDM (Active hydrogen unit equivalent weight: 49.5 g/eq.) | — | — | — | — | — |
| | DDE (Active hydrogen unit equivalent weight: 50 g/eq.) | — | — | — | — | — |
| Inorganic filler | SC2050MTO | 190 | 234 | 176 | 215 | 190 |
| | AC4130Y | 10 | 26 | 44 | 15 | 10 |
| Equivalent ratio (ratio of amine curing agent equivalent weight to thermosetting resin equivalent weight) | | 1.49 | 1.49 | 1.54 | 1.49 | 1.75 |

\* DDS: 4,4'-diaminodiphenyl sulfone
\* TFB: 2,2'-bis(trifluoromethyl)benzidine; 2,2'-bis(trifluoromethyl)-4,4'-biphenyldiamine
\* DDM: 4,4'-diaminodiphenyl methane
\* DDE: 4,4'-diaminodiphenyl ether
\* XD-1000: Epoxy resin (Nippon Kayaku)
\* NC-3000H: Epoxy resin (Nippon Kayaku)
\* HP-6000: Naphthalene-based epoxy resin (DIC Corporation)
\* BMI-2300: Bismaleimide resin (DAIWA KASEI)
\* SC2050MTO: Phenylamino silane-treated slurry type of microsilica, average particle diameter of 0.5 μm (Admantechs)
\* AC4130Y: Methacryl silane-treated slurry type of nanosilica, average particle diameter of 50 nm (Nissan Chemical)
\* Equivalent ratio: Calculated through Mathematical Equation 1 below.

[Mathematical Equation 1]

Equivalent Ratio of Amine Curing Agent to Thermosetting Resin = (Total Active Hydrogen Equivalent Weight of DDS + Total Active Hydrogen Equivalent Weight of TFB + Total Active Hydrogen Equivalent Weight of DDM + Total Active Hydrogen Equivalent Weight of DDE)/{(Total Epoxy Resin Equivalent Weight of XD-1000 + Total Epoxy Resin Equivalent Weight of NC-3000H + Total Epoxy Resin Equivalent Weight of HP-6000) + (Total Maleimide Equivalent Weight of BMI-2300)}

In Mathematical Equation 1, the total active hydrogen equivalent weight of DDS is a value obtained by dividing the total weight (g) of DDS by the active hydrogen unit equivalent weight of DDS (62 g/eq.), the total active hydrogen equivalent weight of TFB is a value obtained by dividing the total weight (g) of TFB by the active hydrogen unit equivalent weight of TFB (80 g/eq.), the total active hydrogen equivalent weight of DDM is a value obtained by dividing the total weight (g) of DDM by the active hydrogen unit equivalent weight of DDM (49.5 g/eq.), the total active hydrogen equivalent weight of DDE is a value obtained by dividing the total weight (g) of DDE by the active hydrogen unit equivalent weight of DDE (50 g/eq.), the total epoxy equivalent weight of XD-1000 is a value obtained by dividing the total weight (g) of XD-1000 by the epoxy unit equivalent weight of XD-1000 (253 g/eq.), the total epoxy equivalent weight of NC-3000H is a value obtained by dividing the total weight (g) of NC-3000H by the epoxy unit equivalent weight of NC-3000H (290 g/eq.), the total epoxy equivalent weight of HP-6000 is a value obtained by dividing the total weight (g) of HP-6000 by the epoxy unit equivalent weight of HP-6000 (250 g/eq.), and the total maleimide equivalent weight of BMI-2300 is a value obtained by dividing the total weight (g) of BMI-2300 by the maleimide unit equivalent weight of BMI-2300 (179 g/eq.).

TABLE 2

Composition of the resin compositions for semiconductor package of comparative examples

| Class | | Comparative Example 1 (unit: g) | Comparative Example 2 (unit: g) | Comparative Example 3 (unit: g) | Comparative Example 4 (unit: g) |
|---|---|---|---|---|---|
| Epoxy resin | XD-1000 (Epoxy unit equivalent weight: 253 g/eq.) | 20 | 20 | — | 80 |
| | NC-3000H (Epoxy unit equivalent weight: 290 g/eq.) | 48 | 48 | 48 | — |

TABLE 2-continued

Composition of the resin compositions for semiconductor package of comparative examples

| Class | | Comparative Example 1 (unit: g) | Comparative Example 2 (unit: g) | Comparative Example 3 (unit: g) | Comparative Example 4 (unit: g) |
|---|---|---|---|---|---|
| | HP-6000 (Epoxy unit equivalent weight: 250 g/eq.) | — | — | 20 | — |
| Bismaleimide | BMI-2300 (Maleimide unit equivalent weight: 179 g/eq.) | 6.2 | 6.2 | 6.2 | 6.2 |
| Amine curing agent | DDS (Active hydrogen unit equivalent weight: 62 g/eq.) | — | — | — | 13.8 |
| | TFB (Active hydrogen unit equivalent weight: 80 g/eq.) | — | — | — | — |
| | DDM (Active hydrogen unit equivalent weight: 49.5 g/eq.) | 25.8 | 25.8 | — | — |
| | DDE (Active hydrogen unit equivalent weight: 50 g/eq.) | — | — | 25.8 | — |
| Inorganic filler | SC2050MTO | 200 | 260 | 230 | 234 |
| | AC4130Y | — | — | — | 26 |
| Equivalent ratio (ratio of amine curing agent equivalent weight to thermosetting resin equivalent weight) | | 1.87 | 1.87 | 1.84 | 0.63 |

\* DDS: 4,4'-diaminodiphenyl sulfone
\* TFB: 2,2'-bis(trifluoromethyl)benzidine; 2,2'-Bis(trifluoromethyl)-4,4'-biphenyldiamine
\* DDM: 4,4'-diaminodiphenyl methane
\* DDE: 4,4'-diaminodiphenyl ether
\* XD-1000: Epoxy resin (Nippon Kayaku)
\* NC-3000H: Epoxy resin (Nippon Kayaku)
\* HP-6000: Epoxy resin (DIC Corporation)
\* BMI-2300: Bismaleimide-based resin (DAIWA KASEI)
\* SC2050MTO: Phenylamino silane-treated slurry type of microsilica, average particle diameter of 0.5 μm (Admantechs)
\* AC4130Y: Methacryl silane-treated slurry type of nanosilica, average particle diameter of 50 nm (Nissan Chemical)
\* Equivalent ratio: Calculated through the same Mathematical Equation 1 as in Table 1.

Experimental Example: Measurement of Physical Properties of Resin Composition for Semiconductor Package, Prepreg, and Copper Clad Laminate Obtained in Examples and Comparative Examples The physical properties of resin compositions for a semiconductor package, prepregs, and copper clad laminates obtained in the examples and comparative examples were measured by the following methods, and the results are shown in Table 3 below.

1. Coefficient of Thermal Expansion (CTE)

The copper foil layers of the copper clad laminates obtained in the examples and comparative examples were removed by etching, and then test specimens were prepared in the MD direction. The measurement was performed from 30° C. to 260° C. at a heating rate of 10° C./min by using TMA (TA Instruments, Q400), and the measured value in a temperature range of 50° C. to 150° C. was recorded as the coefficient of thermal expansion.

2. Resin flow (RF)

(1) Initial Resin Flow

In the prepreg state obtained in the examples and comparative examples, RF was measured according to IPC-TM-650 (2.3.17) using Carver press (Carver, Inc., #3893.4NE0000).

(2) Resin Flow after One Month

According to IPC-TM-650 (2.3.17), the prepregs obtained in the Examples and Comparative Examples were stored at room temperature for one month, and RF was measured using a Carver press (Carver, Inc., #3893.4NE0000).

3. Miscibility

In the copper clad laminates obtained in the examples and comparative examples, the copper foil layer on one side thereof was removed by etching, and then the surface of the prepreg was observed with an optical microscope to confirm whether or not the separation between the resin and the inorganic filler occurred. The miscibility was evaluated under the following criteria.

○: Separation between the resin and the inorganic filler did not occur

X: Separation between the resin and the inorganic filler did occur

4. Viscosity

For the prepregs obtained in the examples and comparative examples, the viscosity was evaluated by measuring it using a rheometer (Anton Paar, Modular Compact Rheometer MCR 302) under the conditions of a temperature range of 50° C. to 200° C. and a heating rate of 5° C./min, a normal force of 5 N, a frequency of 10 Hz, and an amplitude of 0.5%, and the temperature indicating the minimum viscosity, and the minimum viscosity, were recorded.

5. Measurement of Tensile Elongation 10 sheets of the prepregs obtained in the examples and comparative examples were laminated in such a manner that the MD and TD directions of the glass fibers were aligned parallel to each other, and pressed for 100 minutes under the conditions of 220° C. and 35 kg/cm², and then the tensile elongation in the MD direction was measured using a Universal Testing Machine (Instron 3365) according to IPC-TM-650 (2.4.18.3).

TABLE 3

Results of Experimental Examples

| Class | CTE (ppm/° C.) | Resin flow (%) | Miscibility | Viscosity Minimum viscosity (Pa·s) | Viscosity Temperature at the minimum viscosity (° C.) | Tensile elongation (%) |
|---|---|---|---|---|---|---|
| Example 1 | 10.5 | 23 | ○ | 270 | 158 | 2.7 |
| Example 2 | 9.1 | 15 | ○ | 315 | 164 | 2.6 |
| Example 3 | 10.3 | 19 | ○ | 256 | 162 | 2.6 |
| Example 4 | 9.9 | 18 | ○ | 302 | 160 | 2.8 |
| Example 5 | 10.4 | 22 | ○ | 265 | 157 | 2.9 |
| Comparative Example 1 | 10.7 | 4.7 | X | 810 | 120 | 2.6 |
| Comparative Example 2 | 9.6 | 3 | X | 987 | 122 | 2.4 |
| Comparative Example 3 | 10.0 | 3.7 | X | 867 | 125 | 2.6 |
| Comparative Example 4 | 9.6 | 16 | ○ | 310 | 163 | 1.7 |

As shown in Table 3, the resin compositions for a semiconductor package of the examples, and the prepregs and the copper clad laminates obtained therefrom, had a coefficient of thermal expansion of 9.1 to 10.5 ppm/° C., indicating low thermal expansion characteristics, and the minimum viscosity thereof was measured to be 256 to 315 Pa·s in a temperature range of 157 to 164° C., while the resin flow could be as high as 15 to 23%, thereby ensuring excellent miscibility. In addition, the measurement results of the tensile elongation showed high toughness of 2.6 to 2.9%, thereby realizing excellent mechanical properties.

On the other hand, the resin compositions for a semiconductor package of Comparative Examples 1 to 3 not containing amine curing agents having an electron withdrawing group (EWG), and the prepregs and the copper clad laminates obtained therefrom exhibited the minimum viscosity of 810 to 987 Pa·s in a temperature range of 120 to 125° C., which is significantly higher than those of the examples, and showed extremely low resin flow of 3 to 4.7%, indicating that the miscibility such as the occurrence of the separation between the resin and the inorganic filler is remarkably poor. On the other hand, it was confirmed that the resin compositions for a semiconductor package of Comparative Example 4 in which the thermosetting resin was contained in an amount of 625 parts by weight based on 100 parts by weight of the amine curing agent and the ratio of the amine curing agent equivalent weight to the thermosetting resin equivalent weight was 0.63, and the prepreg and the copper clad laminate obtained therefrom had tensile elongation of 1.7%, which was decreased as compared to those of the examples, indicating that there was a limit in toughness.

Accordingly, when the thermosetting resin was contained in an amount of 400 parts by weight or less relative to 100 parts by weight of the amine curing agent having an electron withdrawing group (EWG), and two types of the inorganic fillers were mixed and used, while satisfying the ratio of the amine curing agent equivalent weight to the thermosetting resin equivalent weight of 1.4 or more, as in the examples, it was confirmed that excellent low thermal expansion characteristics, flow properties, mechanical properties, and miscibility could be secured.

The invention claimed is:

1. A resin composition comprising:
    an amine curing agent containing one or more functional groups selected from the group consisting of a sulfone group, a carbonyl group, a halogen group, an alkyl group having 1 to 20 carbon atoms, an aryl group having 6 to 20 carbon atoms, a heteroaryl group having 2 to 30 carbon atoms, and an alkylene group having 1 to 20 carbon atoms;
    a thermosetting resin; and
    an inorganic filler comprising a first microparticle inorganic filler, and a second nanoparticle inorganic filler;
    wherein the thermosetting resin is present in an amount of 400 parts by weight or less based on 100 parts by weight of the amine curing agent,
    the alkyl group having 1 to 20 carbon atoms, the aryl group having 6 to 20 carbon atoms, the heteroaryl group having 2 to 30 carbon atoms, and the alkylene group having 1 to 20 carbon atoms contained in the amine curing agent are each independently substituted with one or more functional groups selected from the group consisting of a nitro group, a cyano group, and a halogen group, wherein the resin composition has an equivalent ratio, calculated by the following Mathematical Equation 1, of 1.4 or more:

Equivalent ratio=Total active hydrogen equivalent weight contained in the amine curing agent/ Total curable functional group equivalent weight contained in the thermosetting resin     [Mathematical Equation 1],and wherein the resin composition has a minimum viscosity at 140° C. or higher, and a minimum viscosity of 100 Pa·s to 500 Pa·s.

2. The resin composition of claim 1, wherein the amine curing agent includes one or more compounds selected from the group consisting of the following Chemical Formulas 1 to 3:

[Chemical Formula 1]

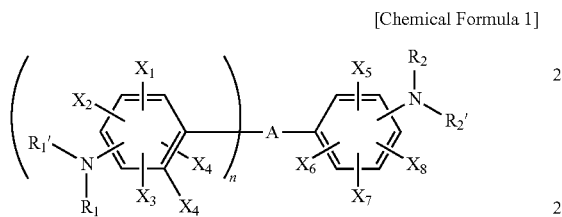

wherein, in Chemical Formula 1,
A is a sulfone group, a carbonyl group, or an alkylene group having 1 to 10 carbon atoms,
$X_1$ to $X_8$ are each independently a nitro group, a cyano group, a hydrogen atom, a halogen group, an alkyl group having 1 to 6 carbon atoms, an aryl group having 6 to 15 carbon atoms, or a heteroaryl group having 2 to 20 carbon atoms,
$R_1$, $R_1'$, $R_2$, and $R_2'$ are each independently a hydrogen atom, a halogen group, an alkyl group having 1 to 6 carbon atoms, an aryl group having 6 to 15 carbon atoms, or a heteroaryl group having 2 to 20 carbon atoms,
n is an integer of 1 to 10, and
the alkylene group having 1 to 10 carbon atoms, the alkyl group having 1 to 6 carbon atoms, the aryl group having 6 to 15 carbon atoms, and the heteroaryl group having 2 to 20 carbon atoms are each independently substituted with one or more functional groups selected from the group consisting of a nitro group, a cyano group, and a halogen group;

[Chemical Formula 2]

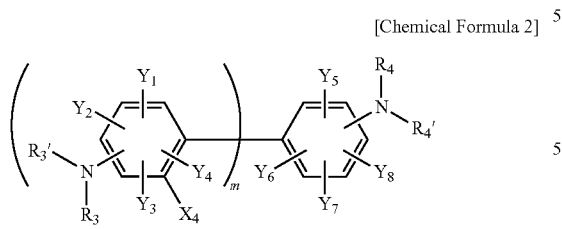

wherein, in Chemical Formula 2,
$Y_1$ to $Y_8$ are each independently a nitro group, a cyano group, a hydrogen atom, a halogen group, an alkyl group having 1 to 6 carbon atoms, an aryl group having 6 to 15 carbon atoms, or a heteroaryl group having 2 to 20 carbon atoms,
$R_3$, $R_3'$, $R_4$, and $R_4'$ are each independently a hydrogen atom, a halogen group, an alkyl group having 1 to 6 carbon atoms, an aryl group having 6 to 15 carbon atoms, or a heteroaryl group having 2 to 20 carbon atoms,
m is an integer of 1 to 10, and
the alkyl group having 1 to 6 carbon atoms, the aryl group having 6 to 15 carbon atoms, and the heteroaryl group having 2 to 20 carbon atoms are each independently substituted with one or more functional groups selected from the group consisting of a nitro group, a cyano group, and a halogen group;

[Chemical Formula 3]

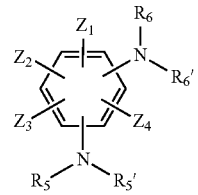

wherein, in Chemical Formula 3,
$Z_1$ to $Z_4$ are each independently a nitro group, a cyano group, a hydrogen atom, a halogen group, an alkyl group having 1 to 6 carbon atoms, an aryl group having 6 to 15 carbon atoms, or a heteroaryl group having 2 to 20 carbon atoms,
$R_5$, $R_5'$, $R_6$, and $R_6'$ are each independently a hydrogen atom, a halogen group, an alkyl group having 1 to 6 carbon atoms, an aryl group having 6 to 15 carbon atoms, or a heteroaryl group having 2 to 20 carbon atoms, and
the alkyl group having 1 to 6 carbon atoms, the aryl group having 6 to 15 carbon atoms, and the heteroaryl group having 2 to 20 carbon atoms are each independently substituted with one or more functional groups selected from the group consisting of a nitro group, a cyano group, and a halogen group.

3. The resin composition of claim 1, wherein the inorganic filler is contained in an amount of 200 parts by weight or more based on 100 parts by weight of the amine curing agent and the thermosetting resin.

4. The resin composition of claim 1, wherein the inorganic filler is present in an amount of 200 parts by weight to 500 parts by weight, based on 100 parts by weight of the amine curing agent and the thermosetting resin.

5. The resin composition of claim 1, wherein the second inorganic filler is present in an amount of 1 part by weight to 50 parts by weight, based on 100 parts by weight of the first inorganic filler.

6. The resin composition of claim 1, wherein the surface of the first inorganic filler or the second inorganic filler, is treated with a silane compound.

7. The resin composition of claim 6, wherein the silane compound includes one or more silane coupling agents selected from the group consisting of an aminosilane coupling agent, an epoxy silane coupling agent, a vinyl silane coupling agent, a cationic silane coupling agent, and a phenylsilane coupling agent.

8. The resin composition of claim 1, wherein the thermosetting resin includes one or more resins selected from the group consisting of an epoxy resin, a bismaleimide resin, a cyanate ester resin, and a bismaleimide-triazine resin.

9. The resin composition of claim 1, wherein the inorganic filler is dispersed in the resin composition.

10. The resin composition of claim 1, wherein the resin composition for has tensile elongation of 2.0% or more, as measured by IPC-TM-650 (2.4.18.3).

11. A prepreg obtained by impregnating a fiber substrate with the resin composition according to claim 1.

12. A metal clad laminate comprising the prepreg according to claim 11, and a metal foil integrated with the prepreg by heating and pressurizing.

13. The resin composition of claim 1, wherein the thermosetting resin comprises an epoxy resin and a bismaleimide resin.

14. The resin composition of claim 1, wherein the equivalent ratio is 1.45 to 1.8.

* * * * *